United States Patent
Kawahara et al.

(10) Patent No.: US 12,009,822 B2
(45) Date of Patent: Jun. 11, 2024

(54) SEMICONDUCTOR DEVICE

(71) Applicant: Mitsubishi Electric Corporation, Tokyo (JP)

(72) Inventors: Kazuhiro Kawahara, Tokyo (JP); Shinji Sakai, Tokyo (JP); Teruaki Nagahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/720,387

(22) Filed: Apr. 14, 2022

(65) Prior Publication Data

US 2023/0070322 A1 Mar. 9, 2023

(30) Foreign Application Priority Data

Sep. 7, 2021 (JP) .................................. 2021-145586

(51) Int. Cl.
*H03K 3/012* (2006.01)
(52) U.S. Cl.
CPC .................................... *H03K 3/012* (2013.01)
(58) Field of Classification Search
CPC .............................. H03K 3/012; H03K 17/14
See application file for complete search history.

(56) References Cited

U.S. PATENT DOCUMENTS

| 11,374,492 | B2* | 6/2022 | Lee | H02M 3/156 |
| 2010/0270984 | A1* | 10/2010 | Park | H02M 1/4225 |
| | | | | 323/210 |
| 2011/0019446 | A1* | 1/2011 | Wu | H02M 3/33523 |
| | | | | 363/79 |
| 2011/0057592 | A1* | 3/2011 | Sicard | H03K 17/08122 |
| | | | | 318/400.26 |
| 2013/0214822 | A1* | 8/2013 | Sakata | H03K 17/223 |
| | | | | 327/109 |
| 2018/0246556 | A1* | 8/2018 | Pasqua | G06F 1/30 |
| 2019/0089351 | A1 | 3/2019 | Noguchi | |
| 2019/0253046 | A1* | 8/2019 | Nakagawa | G01R 19/16519 |

FOREIGN PATENT DOCUMENTS

JP 2019-057985 A 4/2019

* cited by examiner

*Primary Examiner* — Sibin Chen
(74) *Attorney, Agent, or Firm* — Studebaker & Brackett PC

(57) ABSTRACT

A semiconductor device includes: a first terminal inputting a first voltage from outside; a drive unit using the first voltage as a power supply voltage and outputting a drive signal; a switching device driven by the drive signal; a second terminal separated from the first terminal and inputting a second voltage from outside; a comparator using a voltage generated from the second voltage as a power supply voltage and outputting an output signal when a voltage generated from the first voltage is less than or equal to a reference potential; and a shut-off switch shutting off a transmission of the drive signal to the switching device from the drive unit in response to the output signal.

14 Claims, 6 Drawing Sheets

SEMICONDUCTOR DEVICE

BACKGROUND OF THE INVENTION

Field

The present disclosure relates to a semiconductor device.

Background

In Dual In-line Package Intelligent Power Module (DIP-IPM), a control IC is connected to the gate of a switching device (for example, see Japanese Patent Laid-Open No. 2019-57985). A power supply voltage for the control IC is supplied from a control power supply.

SUMMARY

Regardless of ON/OFF of the switching device, current consumption occurs in the control IC when the control power supply is turned on. Accordingly, power consumption can be reduced by turning off the control power supply, for example, in a system standby state where the system is not operating. However, in a semiconductor device of related art, when the control power supply is turned off, an unfixed voltage is applied to the switching device from the control IC, which makes the operation of the semiconductor device unstable. This makes it difficult to reduce power consumption in the control IC by turning off the control power supply.

The present disclosure has been made to solve the above-described issue and is directed to obtaining a semiconductor device in which power consumption can be reduced without making the operation of the semiconductor device unstable.

A semiconductor device according to the present disclosure includes: a first terminal inputting a first voltage from outside; a drive unit using the first voltage as a power supply voltage and outputting a drive signal; a switching device driven by the drive signal; a second terminal separated from the first terminal and inputting a second voltage from outside; a comparator using a voltage generated from the second voltage as a power supply voltage and outputting an output signal when a voltage generated from the first voltage is less than or equal to a reference potential; and a shut-off switch shutting off a transmission of the drive signal to the switching device from the drive unit in response to the output signal.

In the present disclosure, the voltage input from the outside power supply by the first terminal is used as a power supply voltage for the drive unit. The voltage input from the outside by the second terminal, which is separated from the first terminal, is used as a power supply voltage for the comparator. Accordingly, even when the control power supply is turned off, the comparator can be operated. When the control power supply is turned off, the comparator and the shut-off switch shut down the transmission of the drive signal to the switching device from the drive unit. Thus, the control power supply can be turned off, for example, in the system standby state. Consequently, power consumption can be reduced without making the operation of the semiconductor device unstable.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
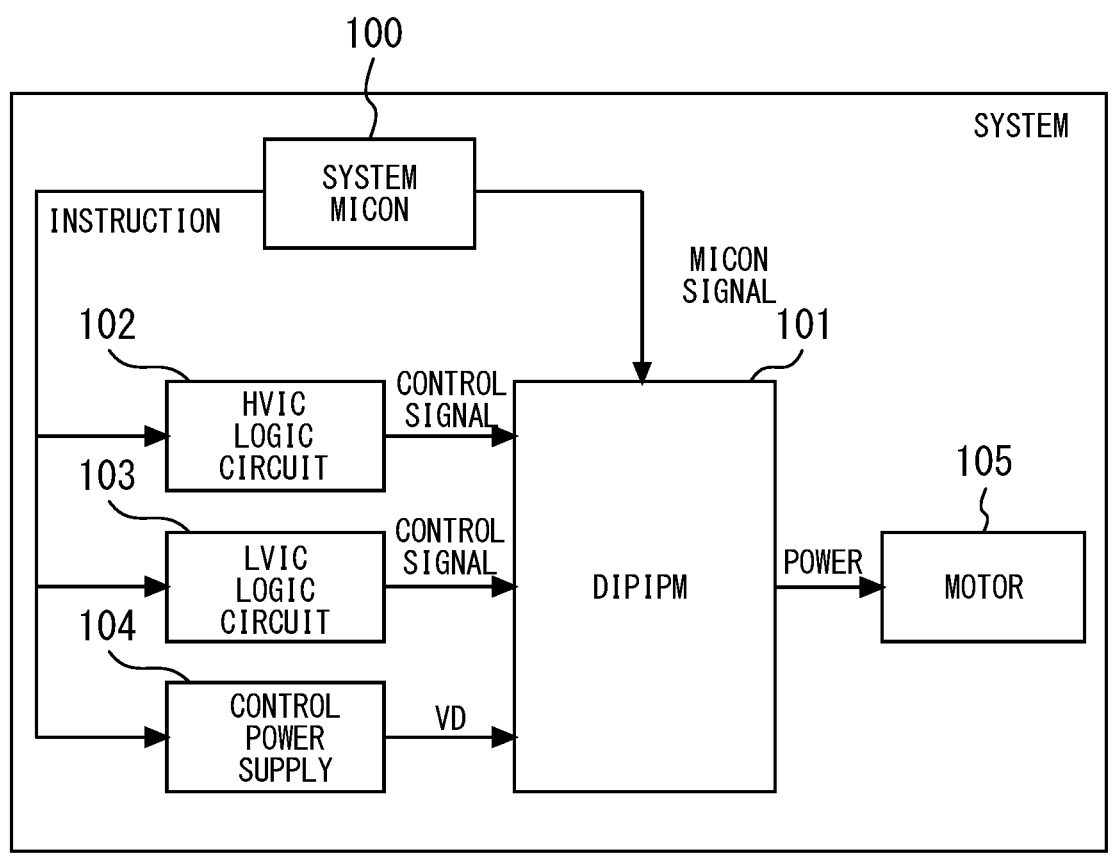
FIG. 1 is a block diagram illustrating a system according to a first embodiment.

FIG. 1 is a block diagram illustrating a system according to a first embodiment. This system is, for example, an air conditioner. Each component of the system is controlled by a system MICON 100. A semiconductor device 101 is a DIPIPM. A HVIC logic circuit 102 and a LVIC logic circuit 103 receive an instruction from the system MICON 100 and provide the semiconductor device 101 with a control signal. The semiconductor device 101 supplies power to a motor 105 according to control signals from the HVIC logic circuit 102 and the LVIC logic circuit 103. A control power supply 104 provides the semiconductor device 101 with a control voltage VD. ON/OFF of the control power supply 104 is controlled by the system MICON 100. In the present embodiment, the system MICON 100 provides the semiconductor device 101 with a MICON signal. The MICON signal will be described below.

Figure 2:
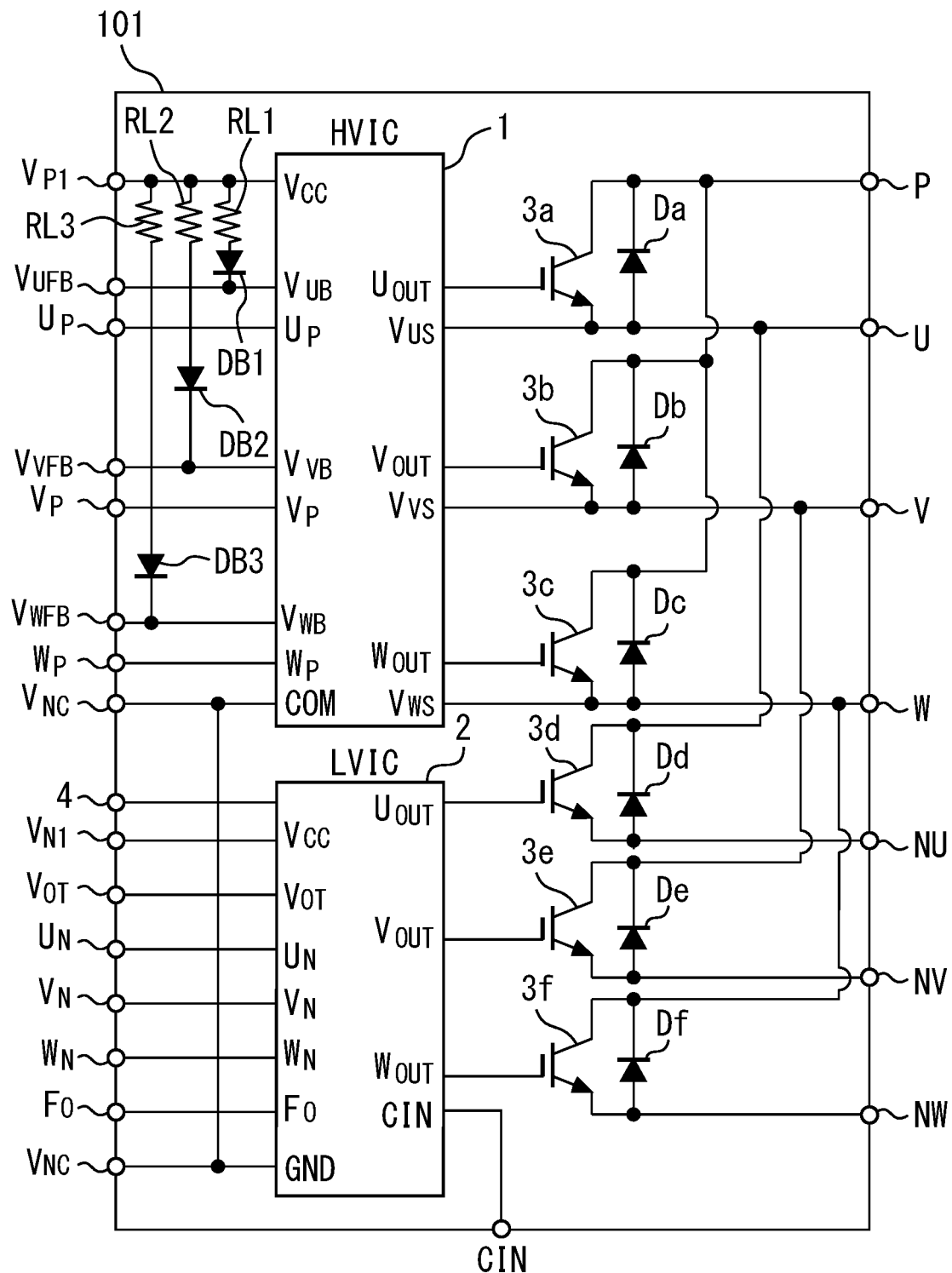
FIG. 2 is a circuit diagram illustrating the semiconductor device according to the first embodiment.

FIG. 2 is a circuit diagram illustrating the semiconductor device according to the first embodiment. The semiconductor device 101 includes a High Voltage Integrated circuit (HVIC) 1, a Low Voltage Integrated circuit (LVIC) 2, three limiting resistors RL1 to RL3, three bootstrap diodes DB1 to DB3, six Insulated Gate Bipolar Transistors (IGBTs) 3a to 3f, and six freewheel diodes Da to Df. The IGBTs 3a to 3f are switching devices for power, but instead may be MOSFETs.

External terminals $V_{P1}$, $V_{UFB}$, $U_P$, $V_{FB}$, $V_P$, $V_{WFB}$, $W_P$, and $V_{NC}$ of the semiconductor device 101 are respectively connected to terminals $V_{CC}$, $V_{UB}$, $U_P$, $V_{VB}$, $V_P$, $V_{WB}$, $W_P$, and COM of a HVIC 1 in the device. External terminals $V_{N1}$, $V_{OT}$, $U_N$, $V_N$, $W_N$, $F_O$, and VNC of the semiconductor device 101 are respectively connected to terminals $V_{CC}$, $V_{OT}$, $U_N$, $V_N$, $W_N$, $F_O$, and GND of a LVIC 2 in the device.

The terminal $V_{P1}$ receives the power supply voltage VD from the HVIC 1. The terminal $V_{N1}$ receives a power supply voltage $V_{CC}$ of the LVIC 2 from the control power supply 104 located outside the device. Control signals from the HVIC logic circuit 102 are input to the HVIC 1 through terminals $U_P$, $V_P$, and $W_P$. Control signals from the LVIC logic circuit 103 are input to the LVIC 2 through terminal $U_N$, $V_N$, and $W_N$.

The limiting resistor RL1 is connected between the terminal $V_{CC}$ of the HVIC 1 and the anode of the bootstrap diode DB1. The limiting resistor RL2 is connected between the terminal $V_{CC}$ of the HVIC 1 and the anode of the bootstrap diode DB2. The limiting resistor RL3 is connected between the terminal $V_{CC}$ of the HVIC 1 and the anode of the bootstrap diode DB3. The cathodes of the bootstrap diodes DB1 to DB3 are respectively connected to the terminals $V_{UB}$, $V_{VB}$, and $V_{WB}$. The terminal COM of the HVIC 1 and the terminal GND of the LVIC 2 are connected.

Terminals $U_{OUT}$, $V_{OUT}$, and $W_{OUT}$ of the HVIC 1 are respectively connected to the gates of the IGBTs 3a to 3c. Terminals $V_{US}$, $V_{VS}$, and $V_{WS}$ of the HVIC 1 are respectively connected to the emitters of the IGBTs 3a to 3c and external terminals U, V, and W of the semiconductor device 101. The collectors of the IGBTs 3a to 3c are each connected to an external terminal P.

The terminals $U_{OUT}$, $V_{OUT}$, and $W_{OUT}$ of the LVIC 2 are respectively connected to the gates of the IGBTs 3d to 3f. A terminal CIN of the LVIC 2 is connected to an external terminal CIN. The collectors of the IGBTs 3d to 3f are respectively connected to the external terminals U, V, and W. The emitters of the IGBTs 3d to 3f are respectively connected to the external terminals NU, NV, and NW.

The freewheel diodes Da to Df are respectively connected to the IGBTs 3a to 3f in an antiparallel manner. The HVIC 1 is a control IC that causes the IGBTs 3a to 3f to operate. The LVIC 2 is a control IC that causes the IGBTs 3a to 3f to operate.

The semiconductor device 101 is provided with a terminal 4 for inputting the MICON signal to the LVIC 2 from the system MICON 100 located outside the device. The terminal 4 is separated from the other terminals such as the terminal $V_{N1}$, and is not connected to devices other than the LVIC 2 and the other terminals in the device. The terminal 4 is not provided on the semiconductor device of related art, and is newly provided in the first embodiment.

Figure 3:
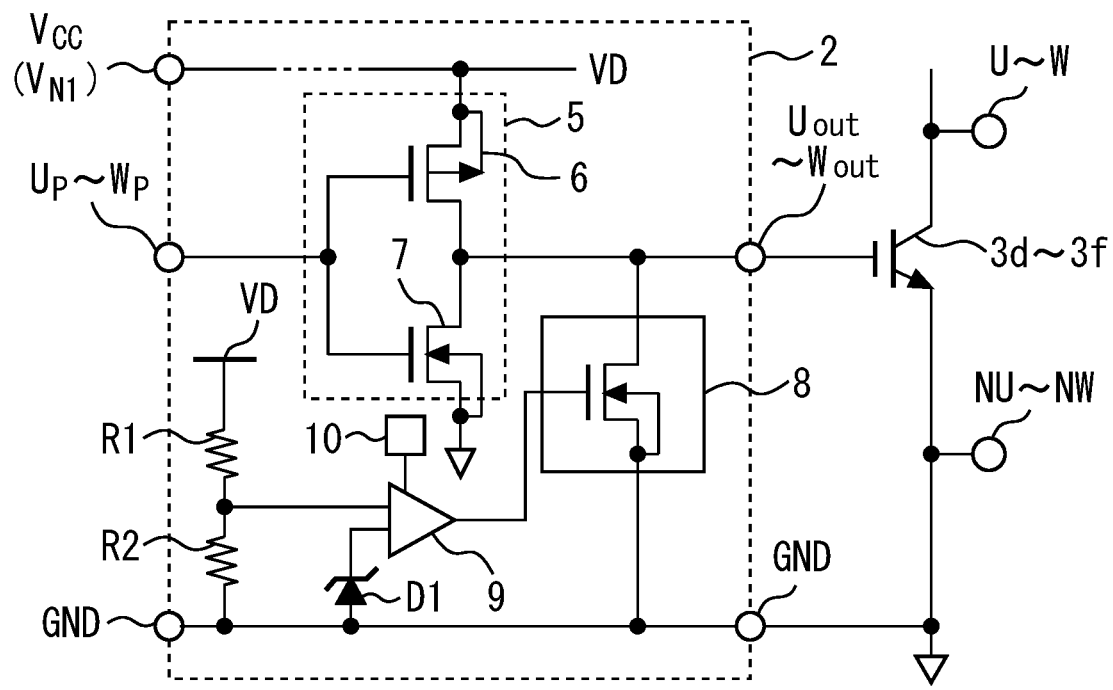
FIG. 3 is a circuit diagram illustrating the LVIC according to the first embodiment.

FIG. 3 is a circuit diagram illustrating the LVIC according to the first embodiment. A drive unit 5 is a CMOS inverter including a PMOSFET 5 and an NMOSFET 6. The drive unit 5 uses the control voltage VD input from the terminal $V_{CC}$ as a power supply voltage, and outputs a drive signal corresponding to the control signal from the LVIC logic circuit 103. The IGBTs 3a to 3f are driven by the drive signal output from the corresponding drive unit 5.

The shut-off switch 8 is a MOSFET. The drain of the shut-off switch 8 is connected to a wire that connects an output terminal of the drive unit 5 and the gate terminal of each of the IGBTs 3d to 3f. The source of the shut-off switch 8 is connected to the terminal GND. An output terminal of a comparator 9 is connected to the gate of the shut-off switch 8. The shut-off switch 8 shuts off the drive signal depending on the output from the comparator 9. A power supply 10 supplies a power supply voltage to the comparator 9. For ease of illustration, FIG. 3 illustrates only one set of the drive unit 5, the shut-off switch 8, the comparator 9, and the power supply 10. In practice, however, each of the three IGBTs 3d to 3f is provided with the set of the drive unit 5, the shut-off switch 8, the comparator 9, and the power supply 10.

Resistors R1 and R2 are connected in series between the terminal GND and the terminal to which the power supply voltage VD of the LVIC 2 is input. A node between the resistors R1 and R2 and the cathode of a Zener diode D1 are each connected to an input terminal of the comparator 9. The anode of the Zener diode D1 is connected to the terminal GND. A reference potential is generated at the cathode of the Zener diode D1. The comparator 9 compares the voltage obtained by dividing the power supply voltage VD by the resistors R1 and R2 with the reference potential. If the voltage is less than or equal to the reference potential, the comparator 9 outputs an output signal. When the control power supply 104 is turned off, 0 V is input to the comparator 9 and the comparator 9 outputs a signal.

The output signal from the comparator 9 is input to the gate of the shut-off switch 8. The shut-off switch 8 shuts off the transmission of the drive signal to the IGBTs 3d to 3f from the drive unit 5 in response to the output signal from the comparator 9. In this case, the output voltage of the LVIC 2 is fixed to 0 V.

Figure 4:
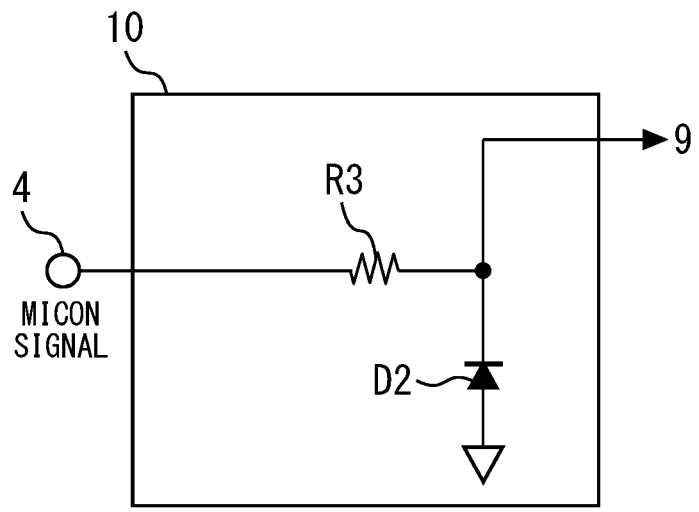
FIG. 4 is a circuit diagram illustrating the power supply of the comparator according to the first embodiment.

FIG. 4 is a circuit diagram illustrating the power supply 10 of the comparator 9 according to the first embodiment. The power supply 10 includes a resistor R3 and a diode D2, and generates a power supply voltage for operating the comparator 9. The terminal 4 is connected to the system MICON 100 provided outside the device. One end of the resistor R3 is connected to the terminal 4, and the other end of the resistor R3 is connected to a power supply terminal of the comparator 9. The anode of the diode D2 is connected to the terminal GND, and the cathode of the diode D2 is connected to the other end of the resistor R3. The MICON signal is input from the system MICON 100 through the terminal 4 and is input to the power supply terminal of the comparator 9 through the resistor R3.

The MICON signal is supplied from one of the power supplies included in the system MICON 100 and has a constant voltage high enough to cause the comparator 9 to operate. It may be required to draw out the terminal 4 for inputting the MICON signal to the outside of the semiconductor device 101. To prevent breakdown of the device due to static electricity applied to the terminal 4, the diode D2 and the resistor R3 for protection are provided.

As described above, in the present embodiment, the voltage VD input from the control power supply 104 provided outside by the terminal $V_{N1}$ is used as a power supply voltage for the drive unit 5. The voltage input from the outside by the terminal 4, which is separated from the terminal $V_{N1}$, is used as a power supply voltage for the comparator 9. Accordingly, even when the control power supply 104 is turned off, the comparator 9 can be operated. When the control power supply 104 is turned off, the comparator 9 and the shut-off switch 8 shut down the transmission of the drive signal to the IGBTs 3d to 3f from the drive unit 5. Thus, the control power supply 104 can be turned off, for example, in the system standby state. Consequently, power consumption can be reduced without making the operation of the semiconductor device unstable.

While the comparator 9 operates even when the control power supply 104 is turned off, the drive unit 5 outputs no signals, so that no current flows to the terminal GND through the shut-off switch 8. Consequently, current consumption can be suppressed.

Even when the control power supply 104 is turned off to reduce current consumption, the system MICON 100 operates while being supplied with power from another route. Accordingly, the use of the MICON signal as the power supply voltage for the comparator 9 enables the comparator 9 to operate even when the control power supply 104 is turned off.

Figure 5:
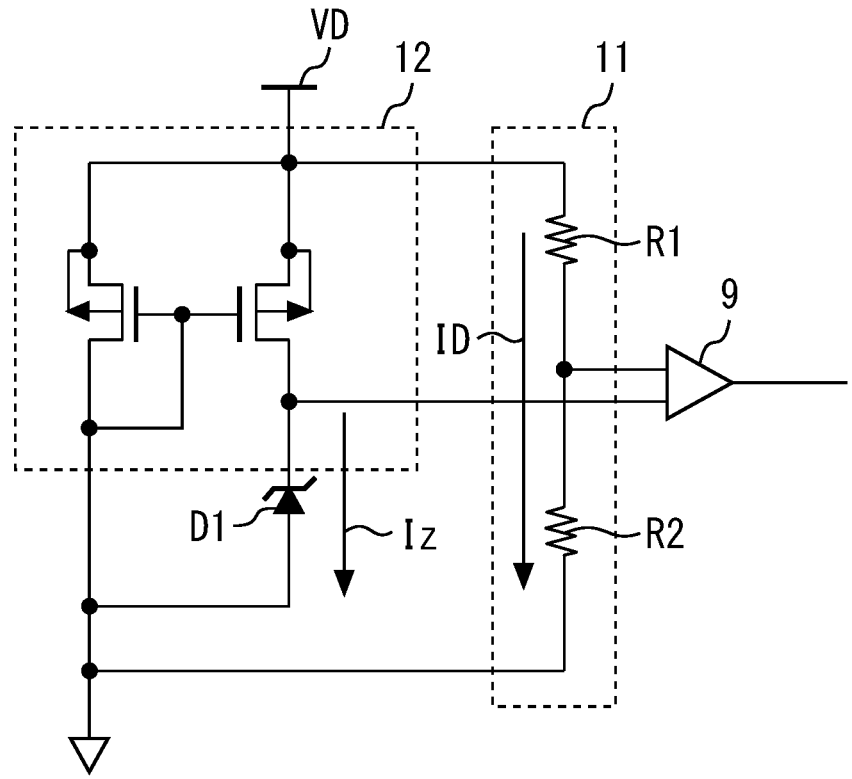
FIG. 5 is a circuit diagram illustrating a modified example of a circuit configuration on the input side of the comparator according to the first embodiment.

FIG. 5 is a circuit diagram illustrating a modified example of a circuit configuration on the input side of the comparator according to the first embodiment. The resistors R1 and R2 constitute a power supply voltage reduction protection signal generation unit 11. The power supply voltage reduction protection signal generation unit 11 outputs the voltage obtained by dividing the power supply voltage VD by the resistors R1 and R2 as a power supply voltage reduction protection signal.

A constant current circuit 12 generates a constant current from the power supply voltage VD. The cathode of the Zener diode D1 is connected to the constant current circuit 12, and the anode of the Zener diode D1 is connected to the terminal GND. The constant current circuit 12 causes a constant current to flow to the Zener diode D1, thereby generating the reference potential at the cathode of the Zener diode D1. The comparator 9 compares the power supply voltage reduction protection signal with the reference potential. When the power supply voltage VD drops and the power supply voltage reduction protection signal is less than or equal to the reference potential, the comparator 9 outputs a signal. As a result, when the power supply voltage VD drops and a protection function is activated, an operation similar to that of the first embodiment is carried out to thereby reduce current consumption. Further, when the control power supply 104 is turned on, a current ID flows to the power supply voltage reduction protection signal generation unit 11, and a current Iz flows to the constant current circuit 12. These currents cause extra current consumption. On the other hand, when the control power supply 104 is turned off, these currents do not flow, so that current consumption can be suppressed.

Second Embodiment

Figure 6:
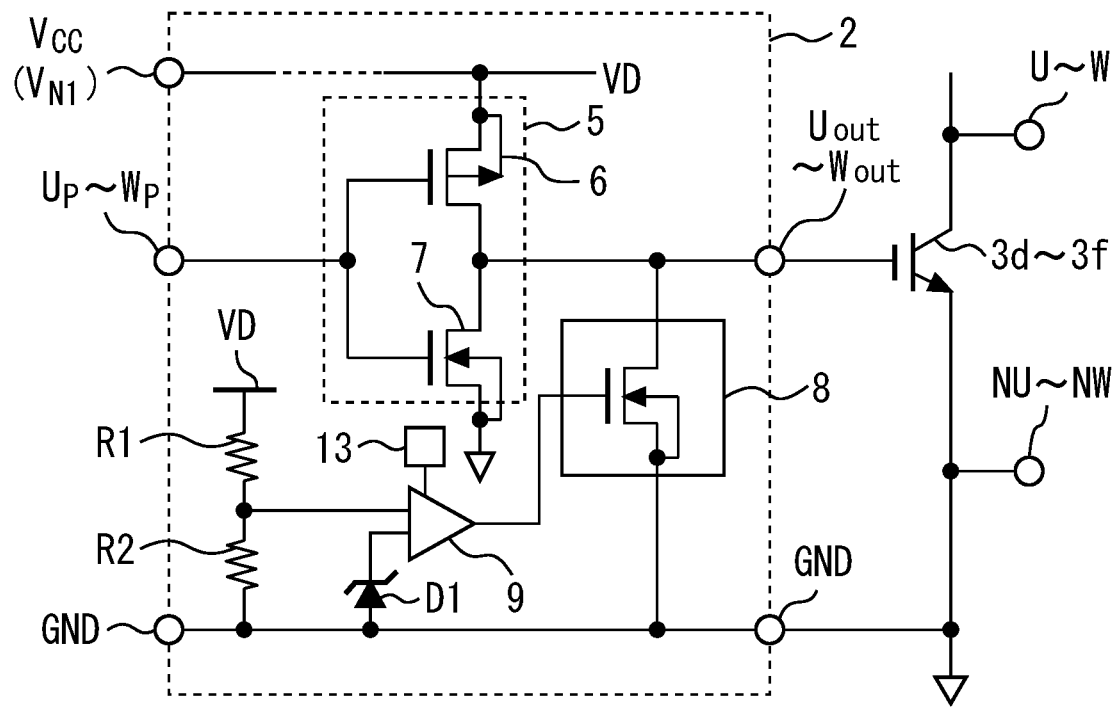
FIG. 6 is a circuit diagram illustrating a semiconductor device according to a second embodiment.

FIG. 6 is a circuit diagram illustrating a semiconductor device according to a second embodiment. In place of the power supply 10 according to the first embodiment, an internal power supply 13 that is provided in the LVIC 2 generates a power supply voltage for the comparator 9 from the power supply voltage $V_{CC}$ of the HVIC 1.

Figure 7:
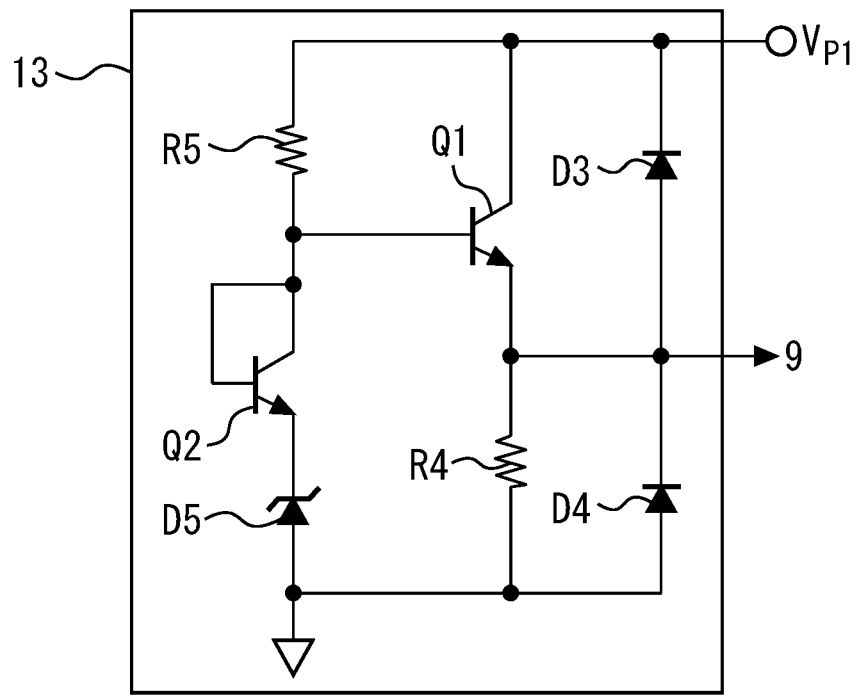
FIG. 7 is a circuit diagram illustrating the internal power supply according to the second embodiment.

FIG. 7 is a circuit diagram illustrating the internal power supply according to the second embodiment. Diodes D3 and D4 are connected in series, transistor Q1 and resistor R4 are connected in series, and a resistor R5, a transistor Q2, and a Zener diode D5 are connected in series between the terminal $V_{P1}$ and the terminal GND. The base and collector of the transistor Q2 are connected to the resistor R5 and the base of the transistor Q1. A node between the transistor Q1 and the resistor R4 and a node between the diodes D3 and D4 are connected to each other, and the voltage is output as the power supply voltage for the comparator 9.

Since the power supply voltage for the comparator 9 is generated from the power supply voltage $V_{CC}$ of the HVIC 1, the terminal for inputting the power supply voltage for the comparator 9 from the outside can be omitted. In other words, in the present embodiment, the terminal 4 connected to the system MICON 100 is not provided, unlike in the first embodiment. Accordingly, an operation similar to that of the first embodiment can be carried out without increasing the number of connection terminals to be connected to the outside. The resistor R3 and the diode D2 for surge protection can also be omitted.

Third Embodiment

Figure 8:
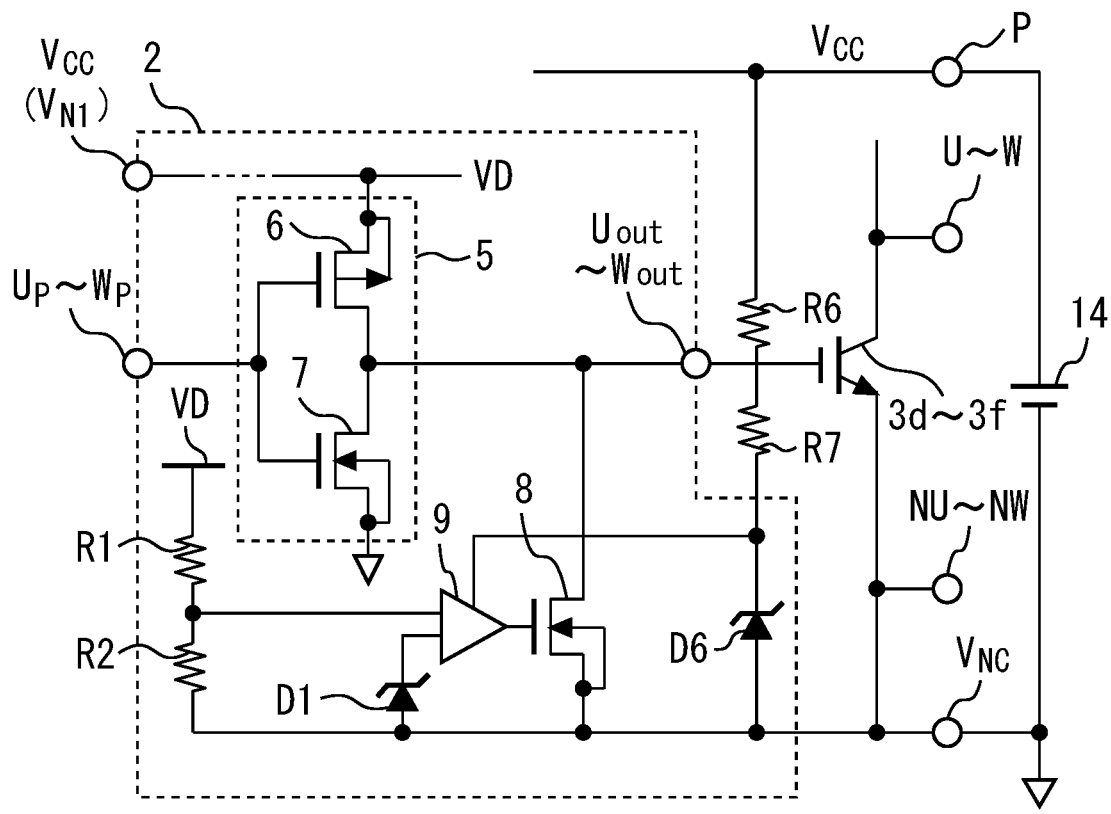
FIG. 8 is a circuit diagram illustrating a semiconductor device according to a third embodiment.

FIG. 8 is a circuit diagram illustrating a semiconductor device according to a third embodiment. The terminal P is connected to the high-voltage side of a high-voltage power supply 14 of the semiconductor device. The low-voltage side of the high-voltage power supply 14 is connected to the terminal $V_{NC}$. Resistors R6 and R7 and a Zener diode D6 are connected in series between the terminal P and the terminal GND. The anode of the Zener diode D6 is connected to the terminal GND, and the cathode of the Zener diode D6 is connected to the resistor R7. A node between the resistor R7 and the cathode of the Zener diode D6 is connected to the power supply terminal of the comparator 9.

The terminal P causes the current input from the high-voltage power supply 14 to flow to the Zener diode D6, and the voltage generated by the current is used as the power supply voltage for the comparator 9. The resistors R6 and R7 limit the current caused to flow to the Zener diode D6.

The power supply voltage for the comparator 9 is generated from the current input to the terminal P, which eliminates the need for the terminal for inputting the power supply voltage for the comparator 9 from the outside. Therefore, an operation similar to that of the first embodiment can be carried out without increasing the number of connection terminals to be connected to the outside.

Fourth Embodiment

Figure 9:
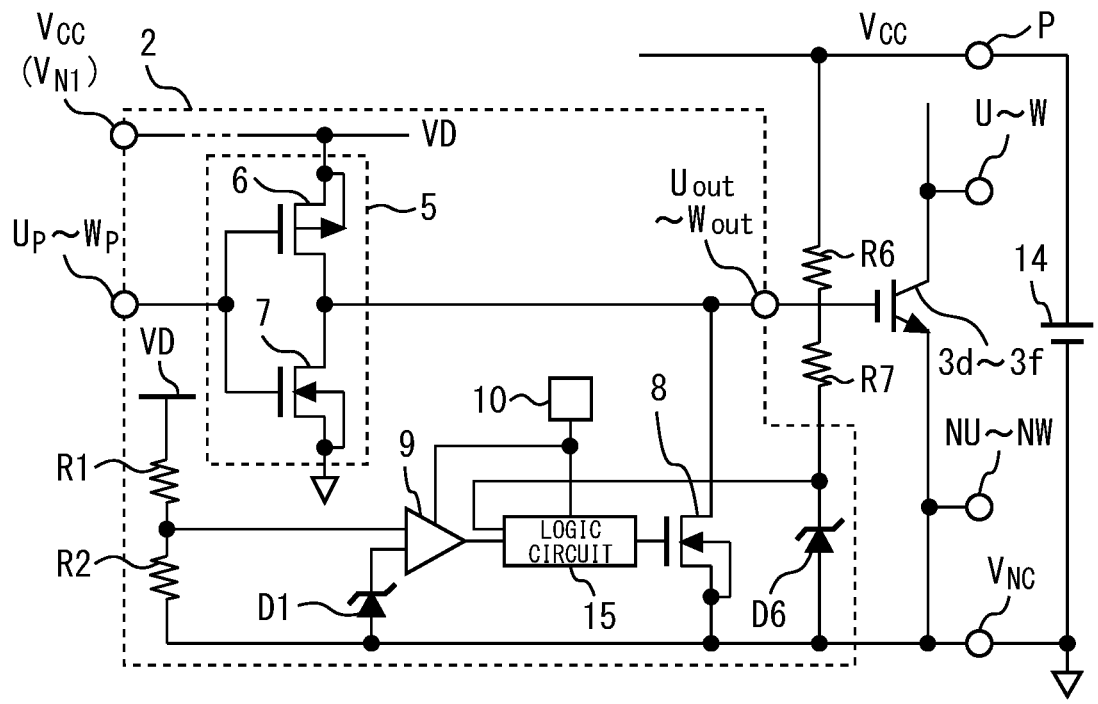
FIG. 9 is a circuit diagram illustrating a semiconductor device according to a fourth embodiment.

FIG. 9 is a circuit diagram illustrating a semiconductor device according to a fourth embodiment. A node between the resistor R7 and the cathode of the Zener diode D6 is connected to a first input terminal of a logic circuit 15. An output terminal of the comparator 9 is connected to a second input terminal of the logic circuit 15. The logic circuit 15 is a circuit using a combination of, for example, a NOR circuit and a NAND circuit. A power supply voltage of the logic circuit 15 is supplied from the power supply 10 that supplies the power supply voltage for the comparator 9. Like in the first embodiment, the power supply 10 supplies the MICON signal as the power supply voltage for the comparator 9.

The logic circuit 15 combines the output voltage from the comparator 9 with the voltage generated by dividing the resistance by the resistors R6 and R7 and Zener diode D6 from the voltage $V_{CC}$ input from the terminal P. The shut-off switch 8 shuts down the drive signal in response to the output from the logic circuit 15. Therefore, an operation similar to that of the first embodiment can be carried out even when the voltage $V_{CC}$ of the high-voltage power supply 14 is 0 V.

Fifth Embodiment

Figure 10:
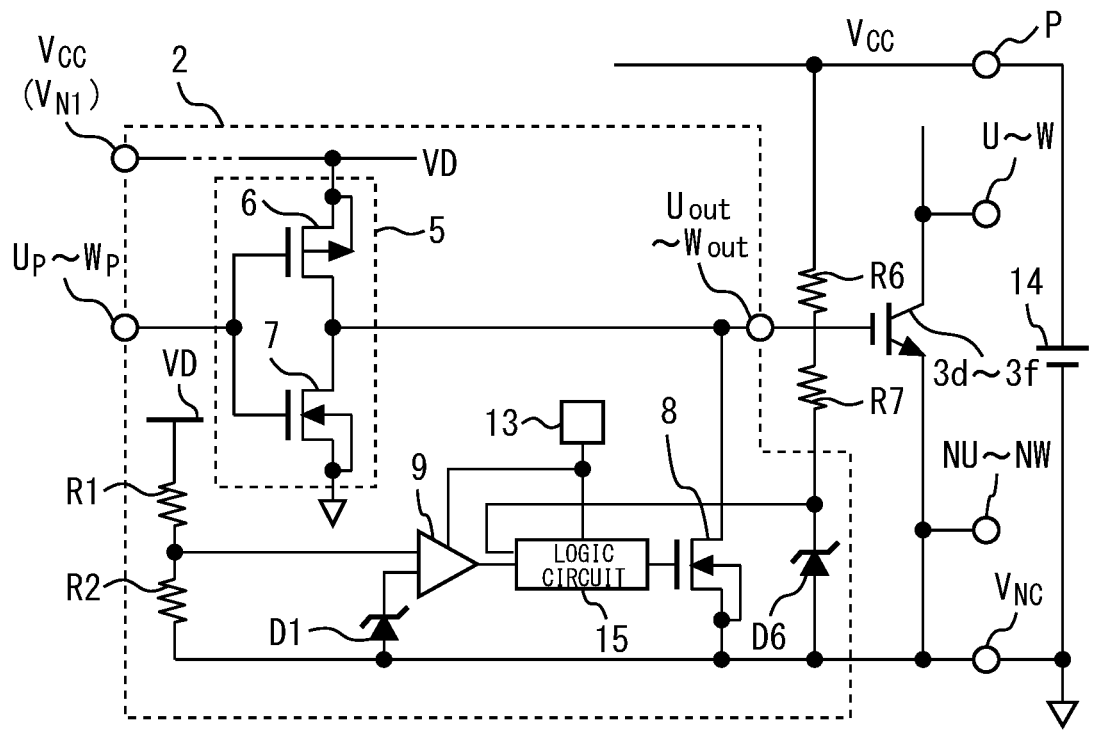
FIG. 10 is a circuit diagram illustrating a semiconductor device according to a fifth embodiment.

FIG. 10 is a circuit diagram illustrating a semiconductor device according to a fifth embodiment. The internal power supply 13 generates a power supply voltage for the comparator 9 and the logic circuit 15 from the power supply voltage for the HVIC 1. The circuit configuration of the internal power supply 13 is similar to that of the second embodiment. Other configurations are similar to that of the fourth embodiment.

The internal power supply 13 generates the power supply voltage for the comparator 9 and the logic circuit 15 from the power supply voltage $V_{CC}$ of the HVIC 1, which eliminates the need for the terminal for inputting the power supply voltage for the comparator 9 and the logic circuit 15 from the outside. Therefore, an operation similar to that of the fourth embodiment can be carried out without increasing the number of connection terminals to be connected to the outside.

The IGBTs 3a to 3f and the freewheel diodes Da to Df are not limited to semiconductor devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved. Both the IGBTs 3a to 3f and the freewheel diodes Da to Df are desirably formed of a wide-bandgap semiconductor. However, only one of the IGBTs 3a to 3f and the freewheel diodes Da to Df may be formed of a wide-bandgap semiconductor. Also in this case, the advantageous effects described in this embodiment can be obtained.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-145586, filed on Sep. 7, 2021 including specification, claims, drawings and summary, on which the convention priority of the present application is based, is incorporated herein by reference in its entirety.

The invention claimed is:

1. A semiconductor device comprising:
a first terminal inputting a first voltage from outside the semiconductor device;
a drive unit using the first voltage as a power supply voltage and outputting a drive signal;
a switching device driven by the drive signal;
a second terminal separated from the first terminal and inputting a second voltage, the second voltage being input even when the first voltage is turned off;
a comparator using a voltage generated from the second voltage as a power supply voltage and outputting an output signal when a voltage generated from the first voltage is less than or equal to a reference potential, the voltage generated from the first voltage being applied to an input terminal of the comparator; and
a shut-off switch shutting off a transmission of the drive signal to the switching device from the drive unit in response to the output signal.

2. The semiconductor device according to claim 1, comprising a low voltage integrated circuit (LVIC) including the drive unit, a high voltage integrated circuit (HVIC) using the second voltage as a power supply voltage, and an internal power supply generating a power supply voltage for the comparator from the power supply voltage of the HVIC.

3. The semiconductor device according to claim 2, wherein the switching device is formed of a wide-band-gap semiconductor.

4. The semiconductor device according to claim 1, wherein the second terminal is a terminal P inputting a current from a high-voltage power supply, and the power supply voltage for the comparator is generated from the current input from the terminal P.

5. The semiconductor device according to claim 4, wherein the switching device is formed of a wide-band-gap semiconductor.

6. The semiconductor device according to claim 1, further comprising a terminal P inputting a voltage from a high-voltage power supply, and a logic circuit combining the output voltage from the comparator with a voltage generated from the voltage input from the terminal P,
wherein the shut-off switch shuts down the drive signal in response to an output from the logic circuit.

7. The semiconductor device according to claim 6, comprising a low voltage integrated circuit (LVIC) including the drive unit, a high voltage integrated circuit (HVIC) using the second voltage as a power supply voltage, and an internal power supply generating a power supply voltage for the comparator and the logic circuit from the second voltage.

8. The semiconductor device according to claim 7, wherein the switching device is formed of a wide-band-gap semiconductor.

9. The semiconductor device according to claim 6, wherein the switching device is formed of a wide-band-gap semiconductor.

10. The semiconductor device according to claim 1, wherein the switching device is formed of a wide-band-gap semiconductor.

11. The semiconductor device according to claim 1, wherein, while the power supply voltage is supplied to the comparator, the comparator outputs the output signal whenever the voltage generated from the first voltage is less than or equal to the reference potential.

12. The semiconductor device according to claim 1, wherein the second terminal is not connected to the first terminal inside the semiconductor device.

13. A semiconductor device comprising:
a first terminal inputting a first voltage from outside the semiconductor device;
a drive unit using the first voltage as a power supply voltage and outputting a drive signal;
a switching device driven by the drive signal;
a second terminal separated from the first terminal and inputting a second voltage;
a comparator using a voltage generated from the second voltage as a power supply voltage and outputting an output signal when a voltage generated from the first voltage is less than or equal to a reference potential, the voltage generated from the first voltage being applied to an input terminal of the comparator; and
a shut-off switch shutting off a transmission of the drive signal to the switching device from the drive unit in response to the output signal, wherein
the second voltage is a microcontroller (MICON) signal input from a system MICON located outside the semiconductor device.

14. The semiconductor device according to claim 13, wherein the switching device is formed of a wide-band-gap semiconductor.

* * * * *